United States Patent [19]

Okino

[11] Patent Number: 5,789,119
[45] Date of Patent: Aug. 4, 1998

[54] IMAGE TRANSFER MASK FOR CHARGED PARTICLE-BEAM

[75] Inventor: Teruaki Okino, Kanagawa-ken, Japan

[73] Assignee: Nikon Corporation, Tokyo, Japan

[21] Appl. No.: 859,038

[22] Filed: May 20, 1997

Related U.S. Application Data

[63] Continuation of Ser. No. 537,004, Oct. 2, 1995, abandoned.

[30] Foreign Application Priority Data

Oct. 26, 1994 [JP] Japan .................. 6-262280

[51] Int. Cl.⁶ .................................................. G03F 9/00
[52] U.S. Cl. ........................... 430/5; 430/296; 430/313
[58] Field of Search ........................... 430/5, 296, 311, 430/313, 314

[56] References Cited

U.S. PATENT DOCUMENTS

| | | | |
|---|---|---|---|
| 5,079,112 | 1/1992 | Berger et al. | 430/4 |
| 5,130,213 | 7/1992 | Berger et al. | 430/4 |
| 5,258,246 | 11/1993 | Berger et al. | 430/4 |
| 5,260,151 | 11/1993 | Berger et al. | 430/5 |
| 5,279,925 | 1/1994 | Berger et al. | 430/246 |
| 5,424,173 | 6/1995 | Wakabayashi et al. | 430/296 |

*Primary Examiner*—S. Rosasco
*Attorney, Agent, or Firm*—Armstrong, Westerman, Hattori, McLeland & Naughton

[57] ABSTRACT

A charged particle-beam transfer mask includes a first area having a low degree of scattering or absorbing of charged particle beams, a second area higher in degree of scattering or absorbing of the charged particle beams than the first area, and dose correction member. This correction member is provided in order that when the charge particle-beams are applied to a sensitive substrate through the first and second areas, a distribution of dose in the sensitive substrate is different from that obtained without the dose correction member. Typically, the dose correction member is constituted by a film which is formed on the first area, and is higher in degree of scattering or absorbing the charged particle-beams than the first area but lower than the second area, and this film is disposed adjacent to the second area in a manner to partly cover the first area.

10 Claims, 6 Drawing Sheets

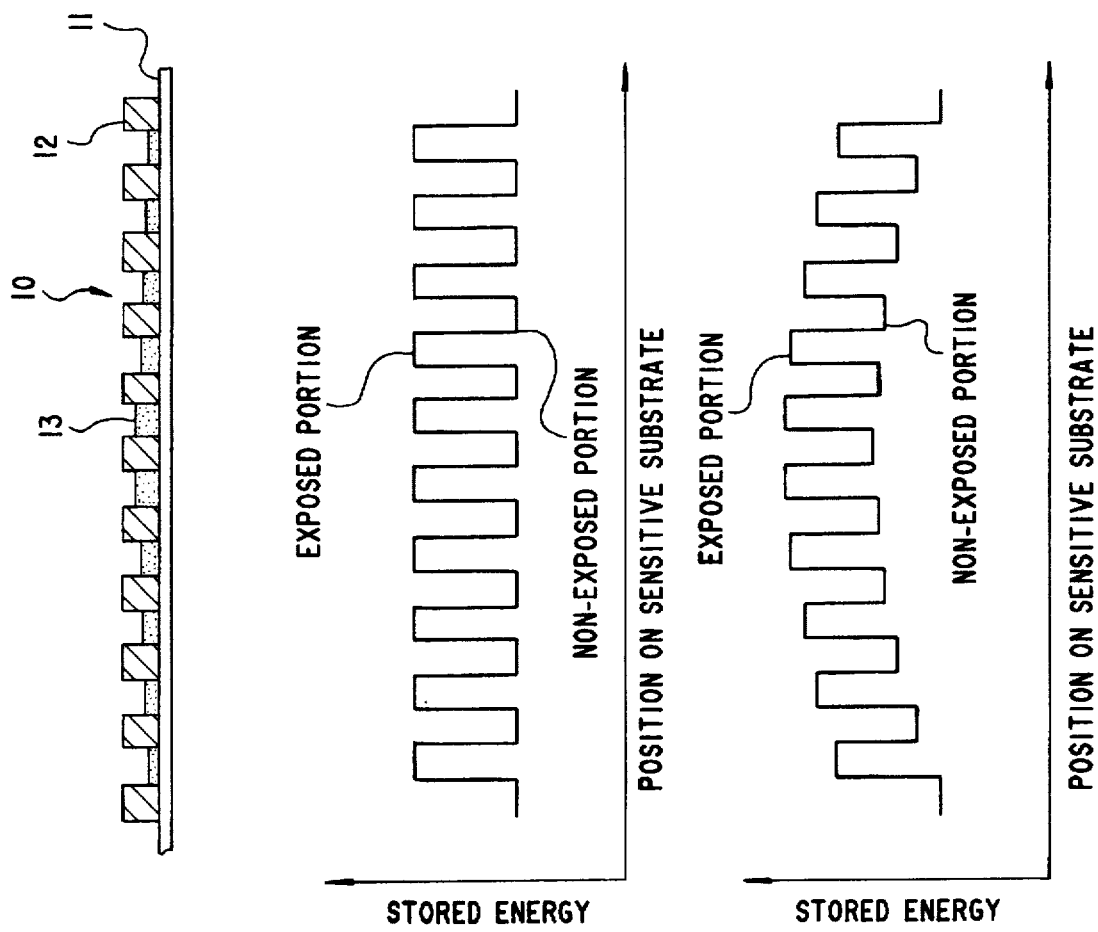

IMAGE TRANSFER MASK FOR CHARGED PARTICLE-BEAM

This application is a continuation of application Ser. No. 08/537,004 filed Oct. 2, 1995, now abandoned.

BACKGROUND OF THE INVENTION

This invention generally relates to a pattern transfer using beams of charged particles (hereinafter referred to as "charged particle-beam) such as, an electron beam and an ion beam.

Among electron-beam exposure devices, the pencil-beam-type and the variable formation type have heretofore been extensively used. Electron beams react a resist (sensitive material) coated on a substrate (such as, a silicon wafer) and a mask blank. Primary electron beams applied to the resist are scattered in the resist and by the substrate, so that the scattered electrons are distributed over an area larger than the area of irradiation of the primary electron beams. Therefore, the resist is reacted not only at the area of irradiation of the primary electron beams but also in the vicinity thereof. After exposure, the resist is developed, and if the dose for a certain portion of the resist exceeds a predetermined level, this portion of the resist remains (in the case of the negative resist), or is removed (in the case of the positive resist) after development as well as the exposed portions.

Due to such unintentional reaction of the resist, for example, where large exposed pattern portions are disposed in proximity to each other with a small gap therebetween, the dose for this gap portion exceeds a predetermined excitement level so that the gap is eliminated or becomes narrower than desired. Such an undesirable phenomenon occurs at those portions or areas where the pattern portions are in proximity to each other, and therefore this phenomenon is called "a proximity effect".

In order to correct the above proximity effect, various methods have been proposed and put into practice. One of these methods is called a dose correction method. In this method, when exposure pattern portions are to be sequentially exposed one by one, electron beams are applied or irradiated to those areas where exposure pattern portions are in proximity to each other, for a time period shorter than a time period relating to irradiation of those areas where exposure patterns are not in proximity to each other, so that the dose for the former areas is reduced. Another method is called a resizing method in which those areas where exposure patterns are in proximity to each other are exposed while correcting exposure pattern data so that the width of a gap in a non-exposure portion can be increased. With these methods, the level of reaction of the resist at the non-exposure portion is lowered so that the non-exposure portion is prevented to a certain degree from assuming a resist film condition similar to that of the exposure portion after exposure.

There is known a further method called a ghost method in which exposure portions are exposed as usual, and non-exposure portions are exposed by electron beams, irradiated in a defocused condition, at a predetermined dose smaller than that of the exposure portions. The degree of reaction of a resist by irradiation of the electron beams is high at those areas where the original non-exposure portion is small, and is low at those areas where the original non-exposure portion is large. By irradiating the electron beams twice, the amount of reaction of the resist at each of the original exposure portion and non-exposure portion is generally constant regardless of the size and density of the exposure pattern so that the pattern almost close to the intended or designed pattern can be obtained after a predetermined development.

In the above methods, the proximity effect cannot be completely corrected, and the dose correction method is thought to be the most effective correction method.

Hereinafter discussed is the correction of the proximity effect in the case of a batch transfer exposure method (including a method in which an optical field is divided into a plurality of sub-fields, and a pattern transfer is effected at a time for each sub-field) for transferring a master pattern, formed at a predetermined area of a mask, to a substrate. Although the resizing method and the ghost method among the above-mentioned three kinds of correction methods can be applied to the batch transfer exposure method, the dose correction method, which is the best correction method, cannot be applied to the batch transfer exposure method. In the batch transfer exposure, divided pattern portions are not exposed one by one, but electron beams are simultaneously applied to a relatively large area of the mask, and those pattern portions in this irradiated area are transferred at a time, and therefore the dose cannot be changed for each pattern portion in the irradiated area. This is a significant drawback in the case of forming a fine pattern by the batch transfer exposure method.

SUMMARY OF THE INVENTION

It is an object of this invention to provide a charged-particle beam transfer mask by which a dose can be accurately and efficiently corrected even in a batch transfer exposure method.

In order to achieve the above object, in the present invention, correction is made to a charged particle-beam transfer mask which comprises a first area having a low degree of scattering or absorbing of charged particle beams, and a second area higher in degree of scattering or absorbing of the charged particle beams than the first area. In order to achieve this correction, dose correction member is provided on at least one of the first and second areas in order that when the charge particle-beams are applied to a sensitive substrate through the first and second areas, a distribution of dose in the sensitive substrate is different from that obtained without the dose correction member.

BRIEF DESCRIPTION OF THE DRAWINGS

FIG. 3 is a view showing a first embodiment of the present invention, portion (a) being a cross-sectional view of a mask for transferring a line-and-space pattern; portion (b) being a diagram showing a distribution of stored energy by the mask of portion (a), and portion (c) being a diagram showing a distribution of the mask of portion (a) without a dose correction treatment;

DESCRIPTION OF THE PREFERRED EMBODIMENTS

Figure 1:
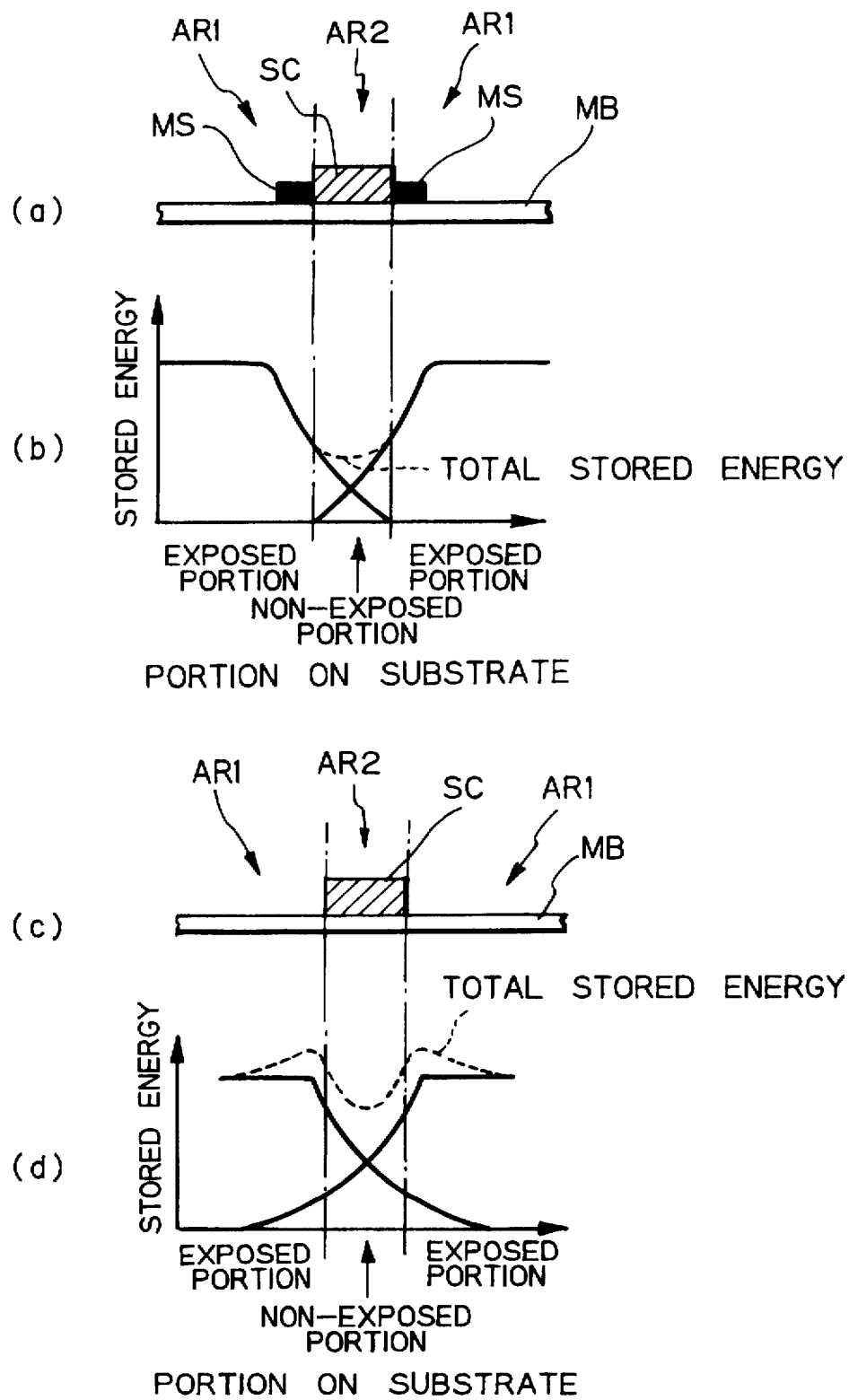
FIG. 1 is a view illustrating of an operation of the present invention, portion (a) being a cross-sectional view of a mask of the invention, portion (b) being a diagram showing a distribution of stored energy obtained with the use of the mask of portion (a), portion (c) being a cross-sectional view of a comparative mask not subjected to a dose correction treatment, and portion (d) being a diagram showing a distribution of stored energy obtained with the use of the mask of portion (c)

First, the principle by which advantageous effects can be obtained in the present invention will be described with reference to FIGS. 1 and 2. Although electron beams are used by way of example in the description given below, any other suitable charged-particle beams (such as, an ion beam) can be used.

Figure 2A:
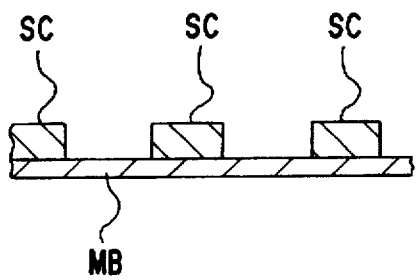
FIG. 2 is a view explanatory of a pattern transfer by electron beams, portion (a) being a cross-sectional view of a scattering mask, portion (b) being a cross-sectional view of a stencil mask, and portion (c) being a view schematically showing a transfer apparatus using the scattering mask.
Figure 2B:
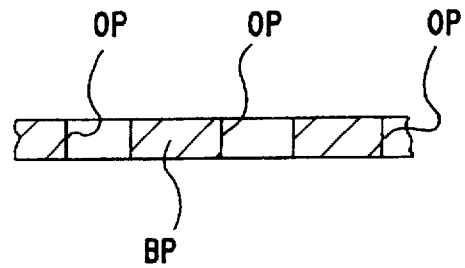
Figure 2C:
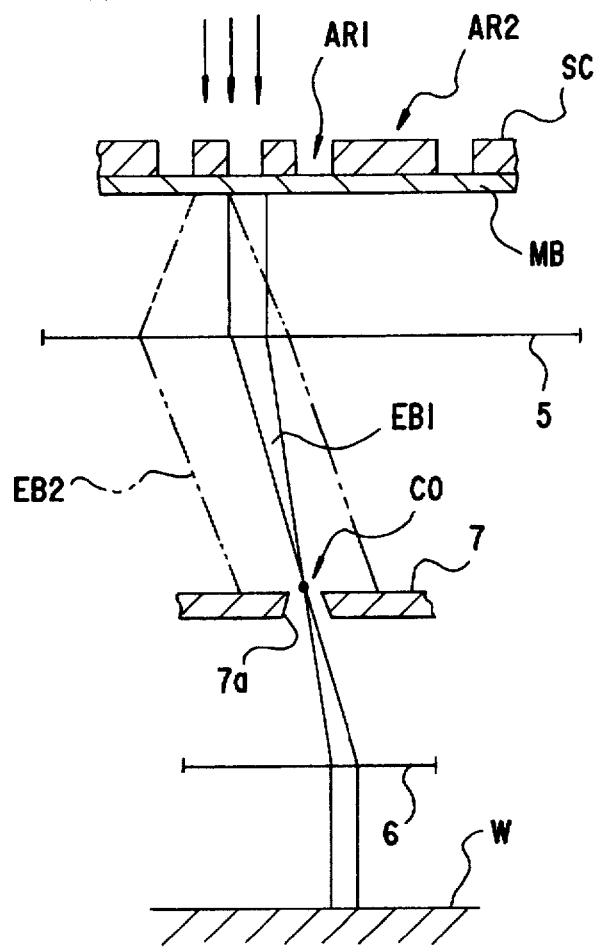

Representative examples of electron-beam transfer masks include a scattering mask (FIG. 2(a)), having a scattering film or coating SC formed on a substrate MB, and a perforated stencil mask (FIG. 2(b)) in which apertures or openings OP for passing electron beams therethrough are formed through a board BP capable of scattering or absorbing the electron beams. Here, the scattering mask will be explained. When electron beams are collectively applied at a time to a selected area of the scattering mask, the electron beams EB2 (indicated in dots-and-dash lines) passing through the scattering film elements SC are greater in forward scattering than the electron beams EB1 (indicated in solid lines) passing through the substrate MB, as shown in FIG. 2(c). In the description given below, with respect to scattering mask, those areas where the scattering film elements SC are provided correspond to second areas AR2, and those areas where gaps between these scattering film elements SC are provided correspond to first areas AR1.

An electron-beam reduction transfer apparatus includes a pair of projection lenses 5 and 6 for projecting a master pattern of the scattering mask onto a sensitive substrate W on a reduced scale, and a scattering aperture member 7 having an aperture 7a for allowing only those electron beams, disposed in the vicinity of a center point of a crossover image CO, therethrough. The degree of scattering of the electron beams by the substrate MB is different from the degree of scattering of the electron beams by the scattering film element SC as described above, and therefore the electron beams EB2 passing through the second area AR2 is intercepted by the scattering aperture member 7 at a greater rate than the electron beams EB1 passing through the first area AR1. As a result, a resist on the sensitive substrate W is exposed in accordance with the configuration of the first areas AR1.

FIG. 1(c) shows a conventional scattering mask not subjected to a dose correction treatment of the present invention, and FIG. 1(d) shows a distribution of stored energy in a resist exposed through the scattering mask of FIG. 1(c). Ideally, the dose of exposed portions of the resist, corresponding to a pair of right and left first areas AR1, should be large, while the dose of a non-exposed portion of the resist, corresponding to a second area AR2, should be substantially zero. However, because of the scattering of electron beams coming from the first areas AR1, the energy is also stored in the non-exposed portion corresponding to the second area AR2 in such a manner that this stored energy is increasing progressively toward the right and left exposed portions. The total stored energy, obtained by adding the stored energy due to the influence of the right and left exposed portions, is indicated by a broken line in FIG. 1(d). If a development level for the resist is generally equal to or smaller than the stored energy shown in the broken line, a gap to be formed in accordance with the non-exposed portion will disappear after development.

FIG. 1(a) shows a mask subjected to the dose correction treatment of the present invention. In this example, in order to achieve the dose correction treatment, intermediate scattering film elements MS are disposed respectively on opposite sides of a scattering film element SC, the intermediate scattering film element MS being higher in degree of scattering of electron beams than a substrate MB but lower than the scattering film element SC. In other words, in FIG. 1(a), by providing the intermediate scattering film element MS, an area which provides a higher degree of scattering of charged particle-beams than each first region AR1 subjected to no treatment, is formed in the first area AR1. A distribution of stored energy in a resist, obtained when applying electron beams to this scattering mask, is shown in FIG. 1(b). The stored energy is reduced at the boundary between each exposed portion and a non-exposed portion by the intermediate scattering film element MS as shown in FIG. 1(b), so that the stored energy in the non-exposed portion is reduced. Therefore, by suitably determining the thickness and size of the intermediate scattering film element MS, or the scattering degree thereof, the total stored energy (indicated by a broken line in FIG. 1(b)) in the non-exposed portion can be kept to a level sufficiently smaller than the stored energy in the exposed portions. In this embodiment, if the development level for the resist is set to about ½ of the stored energy in the exposed portions, a gap corresponding to the non-exposed portion can be formed in such a manner that the gap has a width as designed. The dose correction treatment may be applied to the second area AR2 as described later.

As described above, in the present invention, the dose correction treatment is applied to the first areas AR1 or the second area AR2, thereby varying the dose distribution of the sensitive substrate relative to the dose distribution obtained without the treatment. Therefore, merely by applying charged particle-beams collectively at a time to a selected area of the mask, the dose correction can be achieved having a level generally equal to that achieved by the conventional dose correction method in which the pattern portions are exposed one by one, while changing the time of irradiation of the charged particle-beams.

Next, a preferred embodiment of the present invention will now be described.

FIG. 3(a) is a cross-sectional view of a first embodiment of a mask of the present invention. This mask 10 is designed for transferring a line-and-space pattern (in which exposed portions and non-exposed portions alternate in one direction) onto a sensitive substrate. The mask 10 comprises a substrate 11 for almost completely transmitting electron beams therethrough, and scattering film elements 12 formed on an upper surface of the substrate 11, the scattering film elements 12 being spaced from one another at predetermined intervals. An intermediate scattering film element 13 is formed on the upper surface of the substrate 11 between two adjacent ones of the scattering film elements 12. The substrate 11 is formed, for example, of a silicon (Si) sheet having a thickness of about several tens of nm. The scattering film elements 12 are made of a material higher in degree of scattering of electron beams than the substrate 11, such as tungsten. The width of the scattering film element 12 and the gap between the adjacent scattering film elements 12 are determined in accordance with the pitch of exposed portions on the sensitive substrate and a reduction rate of a transfer apparatus. For example, if the reduction rate for transferring the pattern from the mask to the sensitive substrate is ¼, and the width of the exposed portion and the non-exposed portion on the sensitive substrate is 0.2 µm, then the width of the scattering film element 12, as well as the gap between the adjacent scattering film elements 12, is set to 0.8 µm. The intermediate scattering film element 13 is higher in degree of scattering of electron beams than the substrate 11 but is lower than the scattering film element 12. For example, if the inter-mediate scattering film elements 13 are made of the same material as the scattering film elements 12, the thickness of the intermediate scattering film element 13 is set to a value smaller than that of the scattering film element 12.

A proximity effect, obtained when transferring the above line-and-space pattern, is larger at a central portion of the pattern, and is smaller at a peripheral portion of the pattern. Therefore, in the case of using the transfer apparatus by which the exposed portions, each corresponding in configuration to the gap between the adjacent scattering film elements as shown in FIG. 2(c), a distribution of stored energy in a resist without the intermediate scattering film elements 13 is as shown in FIG. 3(c), and the stored energy is decreasing progressively away from the central portion of the pattern. Therefore, in this embodiment, the thickness of the intermediate scattering film elements 13 is progressively decreased from the central portion of the pattern toward the peripheral portion thereof. With this structural arrangement, the degree of scattering of electron beams passing through the gaps between the scattering film elements 12 is progressively increasing toward the central portion of the pattern. Therefore, this effect and the proximity effect cancel each other so that the stored energy in the exposed portions is generally constant irrespective of the central portion and peripheral portion of the pattern, as shown in FIG. 3(b). Therefore, the stored energy in the non-exposed portions will not exceed relative to a predetermined development level for the resist so that the non-exposed portions are prevented from being developed.

In this embodiment, those areas where scattering film elements 12 are provided correspond to second areas, and those areas where the gaps between the scattering film elements 12 are provided correspond to first areas. All of the first areas correspond to areas in which the degree of scattering of charged particle-beams is higher than that obtained without the treatment. This embodiment may be modified in such a manner that the intermediate scattering film elements 13 are formed on part of the first areas, respectively.

Figure 4:
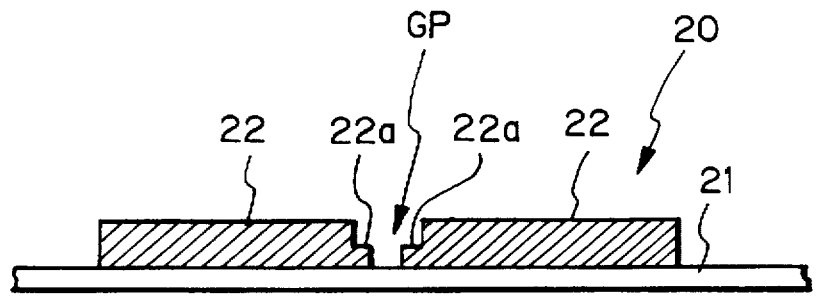
FIG. 4 is a cross-sectional view of a second embodiment of a mask of the invention.

FIG. 4 is a cross-sectional view showing a second embodiment of a mask of the present invention. In this mask 20, in order to form a narrow exposed portion on a sensitive substrate, a pair of scattering film elements 22 are formed on an upper surface of a substrate 21, and are spaced from each other to form a very small gap GP therebetween. Stored energy in the exposed portion formed by this narrow gap GP is smaller as compared with the case of forming an exposed portion of a large cross-sectional area. Here, it is assumed that the exposed portion is an aggregation of a number of minute picture elements. When the area of the exposed portion is large, each picture element is subjected to an internal proximity effect (in which the stored energy is increased) due to the influence of scattered electrons from the neighboring picture elements. However, if the area of the exposed portion is small, such an effect is hardly expected. Therefore, it is possible that the stored energy sufficiently large to exceed the development level is not applied to the gap GP over an entire area thereof. Therefore, in this embodiment, an intermediate scattering portion 22a of a smaller thickness is formed at each end of the scattering film element 22. The degree of scattering of electron beams passing through this intermediate scattering portion 22a is smaller than the degree of scattering of electron beams passing through a central portion of the scattering film element 22. Therefore, the stored energy in the exposed portion corresponding to the gap GP becomes larger than that obtained without the treatment. The effect of dose correction by the intermediate scattering portion 22a can be adjusted by changing the width and thickness of the intermediate scattering portion 22a.

In this embodiment, those areas where the scattering film elements 22 are provided correspond to second areas, and the gaps between the scattering film elements 22 correspond to first areas. The intermediate scattering portions 22a correspond to areas where the degree of scattering of charged particle-beams is lower in the second areas than that obtained without the treatment.

Figure 5:
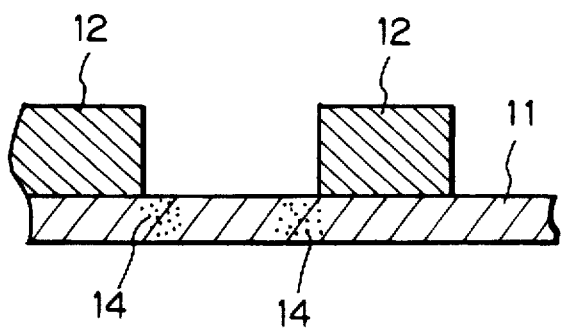
FIG. 5 is a view showing a modified dose correction treatment.
Figure 6:
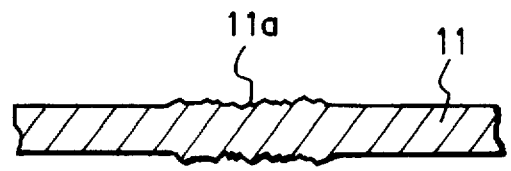
FIG. 6 is a view showing another modified dose correction treatment.

In the above embodiments, although the present invention has been described by way of the scattering masks, the present invention can be applied to a perforated stencil mask as shown in FIG. 2(b). For example, an intermediate scattering film is formed in part of each aperture OP in FIG. 2(b), or part of the board BP is reduced in thickness, thereby reducing the rate of absorption of charged particle-beams. The dose correction treatment does not always depend on the addition of the intermediate scattering film or the reduction of the thickness of the scattering film. For example, this can be achieved by doping a heavy element 14 in required portions of a substrate 11, as shown in FIG. 5. In this case, the larger the doping density is, the higher the degree of scattering of charged particle-beams. Also, a dose correction treatment can be achieved by forming coarse surface portions 11a on required portions of a substrate to thereby changing a scattering degree, as shown in FIG. 6.

Figure 7A:
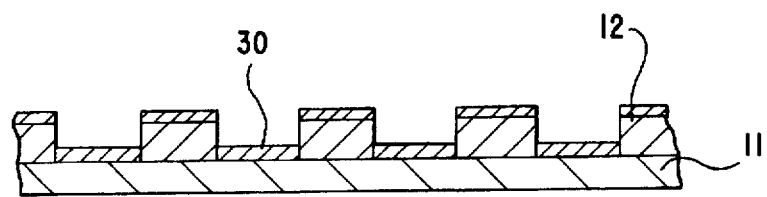
FIG. 7 is a view showing one example of procedure for forming the mask of FIG. 3.
Figure 7B:
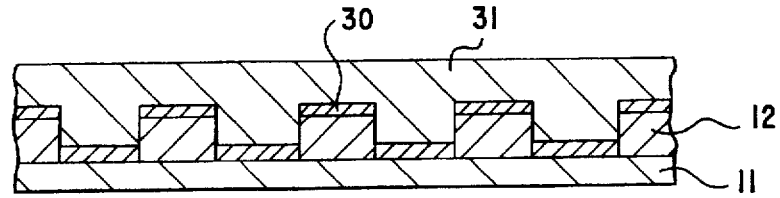
Figure 7C:
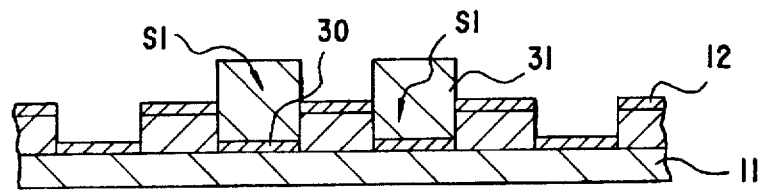
Figure 7D:
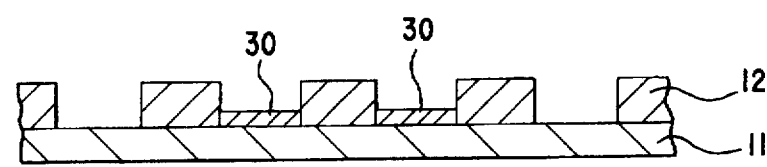

One example of a method of forming the mask of FIG. 3 will now be described. FIG. 7 shows one example of procedure of forming the intermediate scattering film elements 13 of different thicknesses in accordance with their respective positions as in the mask 10 of FIG. 3. Illustration of the procedure of forming the substrate 11, as well as the procedure of forming the scattering film elements 12 on the substrate 11, is omitted. In this example, first, a thin film 30 of a substance constituting the intermediate scattering elements 13 is formed on the entire surface of the mask by a known film-forming method such as vapor-deposition and sputtering, so that the substrate 11 and the scattering film elements 12 are covered with this thin film 30, as shown in FIG. 7(a). Then, a resist 31 is coated onto the thin film 30 (FIG. 7(b)), and then the mask is subjected to a lithography treatment so that the resist 31 remains only on those areas (in this example, two areas S1 between which the center of the pattern lies) where the intermediate scattering film elements 13 of the largest thickness are to be formed (FIG. 7(c)). Thereafter, the exposed thin film 30 except for that portion thereof covered by the resist 31 is removed, and then the remaining resist 31 is removed. As a result, the thin film 30 remains only in part of the spaces between the adjacent scattering film elements 12, as shown in FIG. 7(d).

Figure 7E:
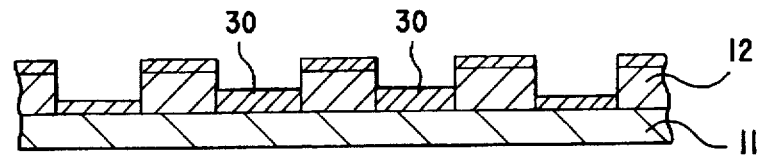
Figure 7F:
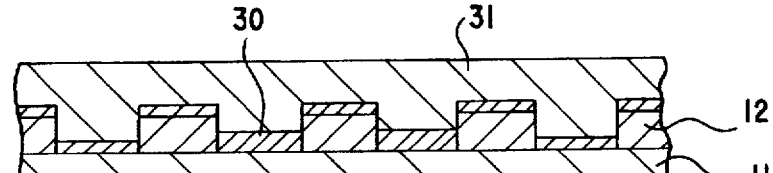
Figure 7G:
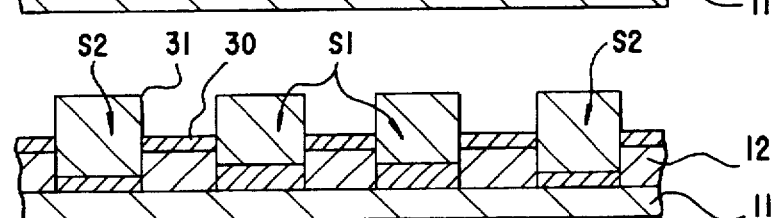
Figure 7H:
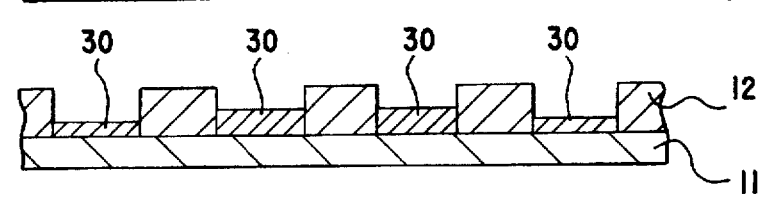
Figure 8A:
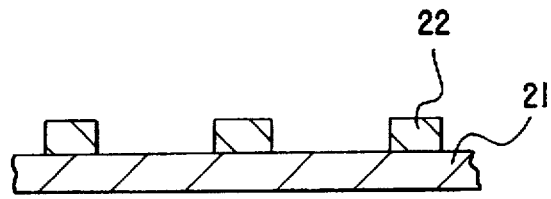
FIG. 8 is a view showing one example of procedure for forming the mask of FIG. 4.
Figure 8B:
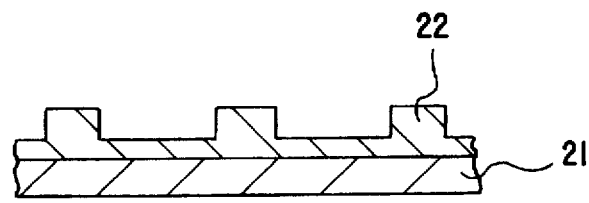
Figure 8C:
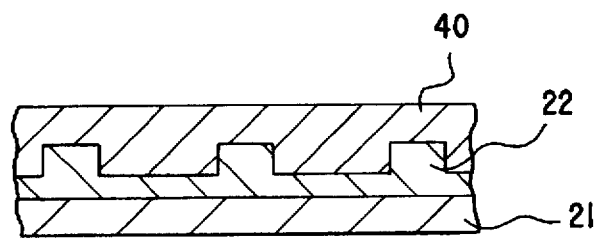
Figure 8D:
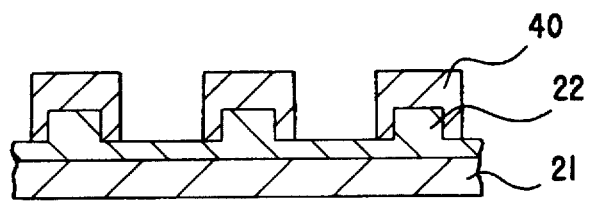
Figure 8E:
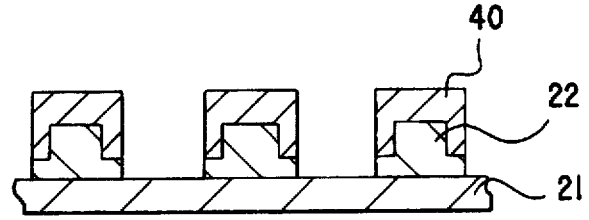
Figure 8F:
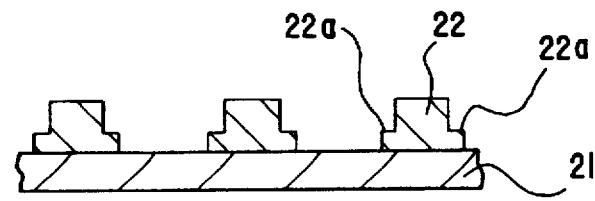

In this condition, a thin film 30 of a substance constituting the intermediate scattering elements 13 is again formed on the entire surface of the mask (FIG. 7(e)), and then a resist 31 is coated onto the thin film 30 (FIG. 7(f)), and then the mask is subjected to a lithography treatment so that the resist 31 remains only on those areas (in this example, four areas S1 and S2 surrounding the center of the pattern) where the intermediate scattering film elements 13 of the largest thickness and the intermediate scattering film elements 13 of the second largest thickness are to be formed (FIG. 7(g)). Thereafter, the exposed thin film 30 (except for that portion thereof covered by the resist 31) is removed, and then the remaining resist 31 is removed. As a result, the thin film portions 30 of different thicknesses remain in the spaces between the adjacent scattering film elements 12, as shown in FIG. 7(h). In this manner, the formation and removal of the thin film 30 are repeated in such a manner that the extent of remaining of the thin film 30 is gradually increased from the area where the intermediate scattering film elements 13 of a larger thickness are to be formed toward the area where the intermediate scattering film elements 13 of a smaller thickness are to be formed. By doing so, the intermediate scattering elements 13 shown in FIG. 3 can be formed.

FIG. 8 shows one example of procedure of forming the intermediate scattering portions 22 at the ends of the scattering film elements 22 as in the mask of FIG. 4. In this example, first, scattering film elements 22 are formed at a predetermined pitch on the upper surface of the substrate 21, as shown in FIG. 8(a). Then, a scattering film of a substance constituting the scattering film elements 22 is formed on the entire surface of the mask to increase the height of the scattering film elements 22 and also to cover the exposed portion of the substrate 21 (FIG. 8(b)). Then, a resist 40 is coated onto the entire surface of the mask (FIG. 8(c)). Then, the mask is subjected to a lithography treatment so that the resist 40 remains only on the top sides and opposite sides of each scattering film element 22 over a predetermined range (FIG. 8(d)). Then, the exposed scattering film (except for that portion thereof covered by the resist 40) is removed (FIG. 8(e)), and then the remaining resist 40 is removed. As a result, the scattering film portions 22, having the intermediate scattering film elements 22a, remain on the substrate 21. The width and thickness of the intermediate scattering film element 22a are adjusted by the thickness of the scattering film formed in the step of FIG. 8(b) and the width of the resist 40 remaining at the step of FIG. 8(d).

As described above, in the present invention, the dose correction treatment is applied directly to the mask, thereby varying the distribution of the stored energy in the sensitive substrate relative to the distribution of the stored energy without the treatment. Therefore, the dose correction of a level generally equal to that achieved by the conventional dose correction method (in which the pattern portions or elements are exposed one by one while changing the time of irradiation of the charged particle-beams) can be achieved in the batch or collective transfer apparatus. Therefore, the influence of the proximity effect is eliminated so that a semiconductor device can be produced with high precision. Since it is not necessary to apply multiple exposure to the same portion of the sensitive substrate as in the ghost method, the throughput of the transfer apparatus can be enhanced.

While the invention has been particularly shown and described in reference to preferred embodiments thereof, it will be understood by those skilled in the art that changes in form and details may be made therein without departing from the spirit and scope of the invention.

What is claimed is:

1. An image transfer mask for charged particle beams comprising:

a first area having a first low degree of scattering or absorbing of the charged particle beams;

a second area having a second degree of scattering or absorbing of the charged particle beams higher than that of said first area; and dose correction member having a third degree of scattering or absorbing of charged particle beams higher than said first degree and lower than said second degree, said dose correction member being provided on at least one of said first and second areas in order that when the charged particle beams are applied to a sensitive substrate through said first and second areas, a distribution of dose in said sensitive substrate is different from that obtained without said dose correction member.

2. An image transfer mask according to claim 1, in which said dose correction member comprises a film which is formed on said first area, and is higher in degree of scattering or absorbing the charged particle beams than said first area but lower than said second area, said film being disposed adjacent to said second area in a manner to at least partly cover said first area.

3. An image transfer mask according to claim 1, in which said first and second areas respectively include a plurality of sections arranged to form a line-and-space pattern and said dose correction member comprises film elements which are formed respectively on at least some of said first area sections in a manner to cover the entire areas thereof, said film elements being higher in degree of scattering or absorbing the charged particle beams than said first area but lower than said second area, the thickness of all of said film elements on said first area being not the same.

4. An image transfer mask according to claim 1, in which said dose correction member is constituted by a portion of said first area which is so treated that the degree of scattering or absorbing of the charged particle beams by that portion is increased.

5. An image transfer mask according to claim 4, in which said treatment for increasing the degree of scattering or absorbing of the charged particle beams is effected by doping a heavy element into a part of said first area.

6. An image transfer mask according to claim 4, in which said treatment for increasing the degree of scattering or absorbing of the charged particle beams is effected by roughening a part of a surface of said first area.

7. An image transfer mask according to claim 1, in which said dose correction member comprises a reduced-thickness portion formed on said second area in adjacent relation to said first area.

8. A semi-conductor device produced through the mask defined by claim 1.

9. An image transfer mask for charged particle beams comprising:

a first area having a first low degree of scattering or absorbing of the charged particle beams;

a second area having a second degree of scattering or absorbing of the charged particle beams higher than that of said first area; and dose correction member having a third degree of scattering or absorbing of charged particle beams higher than said first degree and lower than said second degree, said dose correction member being provided on at least one of said first and second areas in order that when the charged particle beams are applied to a sensitive substrate through said first and second areas, a distribution of dose in said sensitive substrate is different from that obtained without said dose correction member, wherein the dose correction member is in the form of a thin film.

10. An image transfer mask for charged particle beams comprising:
- a first area having a first low degree of scattering or absorbing of the charged particle beams;
- a second area having a second degree of scattering or absorbing of the charged particle beams higher than that of said first area; and
- dose correction member having a third degree of scattering or absorbing of charged particle beams higher than said first degree and lower than said second degree, said dose correction member being provided on at least one of said first and second areas in order that when the charged particle beams are applied to a sensitive substrate through said first and second areas, a distribution of dose in said sensitive substrate is different from that obtained without said dose correction member, wherein the dose correction member is disposed on the first area.

* * * * *